United States Patent [19]
Chuang et al.

[11] Patent Number: 6,002,630
[45] Date of Patent: Dec. 14, 1999

[54] ON CHIP VOLTAGE GENERATION FOR LOW POWER INTEGRATED CIRCUITS

[75] Inventors: Weitong Chuang, Taichung; Chun-Hsiung Hung, Hsinchu; Kuen-Long Chang, Mucha Taipei, all of Taiwan

[73] Assignee: Macronix International Co., Ltd., Hsinchu, Taiwan

[21] Appl. No.: 09/029,945
[22] PCT Filed: Nov. 21, 1997
[86] PCT No.: PCT/US97/21513
§ 371 Date: Mar. 4, 1998
§ 102(e) Date: Mar. 4, 1998
[87] PCT Pub. No.: WO99/27537
PCT Pub. Date: Jun. 3, 1999
[51] Int. Cl.[6] ..................................................... G11C 7/00
[52] U.S. Cl. ................ 365/226; 365/189.09; 365/230.06
[58] Field of Search .............................. 365/226, 230.06, 365/189.09; 327/540, 541

[56] References Cited

U.S. PATENT DOCUMENTS

| | | | |
|---|---|---|---|
| 5,267,201 | 11/1993 | Foss et al. | 365/189.09 |
| 5,440,520 | 8/1995 | Schutz et al. | 365/226 |
| 5,511,026 | 4/1996 | Cleveland et al. | 365/189.09 |
| 5,526,253 | 6/1996 | Duley | 363/59 |
| 5,537,077 | 7/1996 | Schnizlein | 327/589 |
| 5,646,902 | 7/1997 | Park | 365/227 |
| 5,663,926 | 9/1997 | Haseo | 365/230.06 |
| 5,706,240 | 1/1998 | Fiocchi et al. | 365/226 |
| 5,889,719 | 3/1999 | Yoo et al. | 365/226 |

*Primary Examiner*—Son T. Dinh
*Attorney, Agent, or Firm*—Haynes & Beffel LLP

[57] ABSTRACT

An on chip voltage generation circuit suitable for use on integrated circuits such as flash memory devices with a low power supply voltage (e.g., 2.7 to 3.6 volts) includes a sense circuit on the integrated circuit which generates an output indicating a level of the supply voltage. The on chip voltage supply circuit generates the on chip voltage in response to the output of the sense circuit and the supply voltage. The sense circuit output indicates the level of the supply voltage so that the on chip voltage supply circuit is able to adapt the amount of boosting utilized to produce the on chip voltage in response. The on chip voltage supply circuit generates the word line voltage at a node coupled to word line driving circuits in the device.

37 Claims, 7 Drawing Sheets

ON CHIP VOLTAGE GENERATION FOR LOW POWER INTEGRATED CIRCUITS

BACKGROUND OF THE INVENTION

1. Field of the Invention

The present invention relates to on chip voltage generation techniques for producing a voltage on chip which is outside the range of a power supply voltage supplied to the chip; and more particularly to the generation of word line voltages on low power memory devices like flash memory, where the power supply voltage may be less than the read potential required for sensing data in the memory.

2. Description of Related Art

Integrated circuits have in the past been manufactured in order to work with a power supply voltage of about 5 volts, within a specified range of +/−10%. Of course other power supply voltages have been utilized. There is a current trend for many applications to design integrated circuits to work with lower power supply voltages. Lower voltages generally result in lower power operation for the devices, and are easier to supply using batteries in small devices. For example, one low supply voltage which is emerging as a standard is specified to operate over a range of about 2.7 to 3.6 volts. Other standards are being developed around even lower voltages.

On chip circuits however are often designed to operate at higher voltages for some purposes. For example, in memory devices, such as flash memory, word lines which supply a gate potential to memory cells are often designed to operate at a read potential of 4 volts or more. Thus, the low power supply voltage is insufficient to supply directly an on chip voltage high enough to drive the word lines. This problem is dealt with by including charge pumps or other voltage supply boosters on the integrated circuits in order to supply the higher working voltages on chip. See for example U.S. Pat. No. 5,511,026 entitled BOOSTED AND REGULATED GATE POWER SUPPLY WITH REFERENCE TRACKING FOR MULTI-DENSITY AND LOW VOLTAGE SUPPLY MEMORIES. The '026 patent describes an integrated circuit memory having charge pumps configured to supply word line voltages at a level higher than the supply potential. Furthermore, the '026 patent describes the use of on chip charge pumps to provide a plurality of word line voltages for multi-level/memory devices, so that a greater working margin is provided between the memory cell states, than would be normally available using a standard supply potential.

One problem associated with the prior art approaches to on chip charge pumps for these purposes arises from the nature of the supply potential to vary over a significant range. For example, when the supply potential ranges from about 2.7 to about 3.6 volts, the amount of voltage boost necessary to produce an on chip 4 volt potential varies from 1.3 to 0.4 volts. A single boost circuit to handle both extremes of the specified range of the supply potential with a 0.2 volt safety margin would require a 1.5 volt boost. The resulting output of the boost circuit would vary from about 4.2 volts when the supply potential is 2.7, to 5.1 volts when the supply potential is 3.6. Thus when the supply potential is at its high range, the power consumed by the boost circuit is wasted.

Furthermore, using traditional approaches, in which the pumping and boosting ratio is fixed, the on chip voltage is often boosted to a level that may be too high. For example, if the target level is specified at a range from 4.0 to 5.0 volts, the boost ratio for a supply potential ranging from 2.7 to 3.6 volts should be set at about 1.5 volts. However, such a ratio will cause the on chip voltage to reach approximately 5.1 volts when the supply potential is high. Even if a voltage regulator is utilized, a large fluctuation can occur on chip. When the on chip voltage is used for word lines on memory devices, such transient fluctuations can affect the sensing speed of sense amplifiers and decrease the reading speed, because the sense amplifiers cannot start to sense the output of the memory cells until the word line level is settled to the steady state.

Accordingly, it is desirable to provide a on chip voltage supply circuit for use with integrated circuits that provides for more precise control of the on chip voltage over a wide range of supply potentials.

SUMMARY OF THE INVENTION

The present invention provides an on chip voltage generation circuit suitable for use on integrated circuits such as flash memory devices with a low power supply voltage (e.g., 2.7 to 3.6 volts). According to one aspect of the invention, it can be characterized as an integrated circuit having a voltage source input adapted to receive a supply potential within a pre-specified range of voltages, and including components on the integrated circuit that use an on chip voltage higher than the pre-specified range for the supply voltage. A sense circuit is included on the integrated circuit which generates an output indicating a level of the supply voltage within the pre-specified range. The on chip voltage supply circuit is coupled to the sense circuit and to the voltage source input and generates the on chip voltage in response to the output of the sense circuit and the supply voltage. The sense circuit output indicates the level of the supply voltage so that the on chip voltage supply circuit is able to adapt the amount of boosting utilized to produce the on chip voltage. For example, the output of the sense circuit in one embodiment comprises a binary signal which indicates whether the supply voltage is above the threshold within the pre-specified range. The on chip voltage supply circuit includes a first element which adds a first amount to the supply voltage to produce the on chip voltage when the binary signal is in a first state, and a second element which adds a second amount to the supply voltage to produce the on chip voltage when the binary signal is in a second state. In other embodiments, the output of the sense circuit indicates the level of the supply voltage relative to a plurality of thresholds, allowing for more control over the boosting circuit operation.

The present invention is particularly adapted for use with memory circuits. Thus according to this aspect of the invention, an integrated circuit memory device is provided having a voltage source input, a memory array, and a plurality of address inputs. The memory array includes a plurality of word lines coupled to the gates of memory cells in the array. The memory cells in the array have a first threshold below a read voltage to indicate a first memory state and a second threshold above the read voltage to indicate a second memory state. Word line driving circuits are responsive to addresses to supply a word line voltage to selected word lines to establish the read voltage at the gates of memory cells coupled to the selected word lines in response to the addresses. An on chip voltage supply circuit as described above generates the word line voltage at a node coupled to the word line driving circuits in response to the output of a circuit that senses the level of the supply voltage, and in response to the supply voltage itself.

According to one additional aspect of the invention, the word line driving circuits comprise a plurality of word line decoder sections, each section coupled to a corresponding subset of the plurality of word lines, and identified by a portion of an address. A selector is coupled to the node at which the word line voltage is generated and to the plurality of word line decoder sections. The selector is responsive to the portion of the address that identifies the word line decoder section to connect the node to a selected word line decoder section. The on chip voltage supply circuit comprises an idle pump which produces a charge on the node that establishes an idle voltage level when the memory is not being read. A section boost pump is provided for boosting the charge on the node by an amount that depends on the output of the sense circuit when a selected decoder section is connected to the node. The section boost pump provides charge to account for the charge lost to the parasitic capacitance of the word line decoder section. A word line boost pump is also included which boosts the charge on the node to account for a charge lost due to the parasitic capacitance of a selected word line within a given section. Address transition circuits are provided to indicate the switching between word lines within a section and enable the word line boost pump, and to indicate the switching between word line decoder sections to enable the section boost pump. The word line boost pump can be enabled on transitions between sections to provide some additional boosting for the switching between word line decoder sections in one embodiment. In an alternative embodiment, an additional boost pump is provided to boost the charge on the node on transitions between word line decoder sections which provides additional charge. In this embodiment, the word line boost pump is not enabled on transitions between word line sections.

According to preferred aspects of the invention, the word line boost pump, the section boost pump, and the additional boost pump are all responsive to the output of the sense circuit to generate an amount of charge which is suited to the level of the supply voltage. Alternatively, less than all of the pumps are responsive to the output of the sense circuit, according to the needs of a particular implementation.

According to another aspect of the invention, the on chip voltage supply circuit is utilized in a memory array of floating gate memory cells, such as a flash memory. The on chip voltage supply circuit provides a regulated word line voltage for use with the flash memory array.

Other aspects and advantages of the present invention can be seen upon review of the figures, the detailed description and the claims which follow.

DETAILED DESCRIPTION

Figure 1:
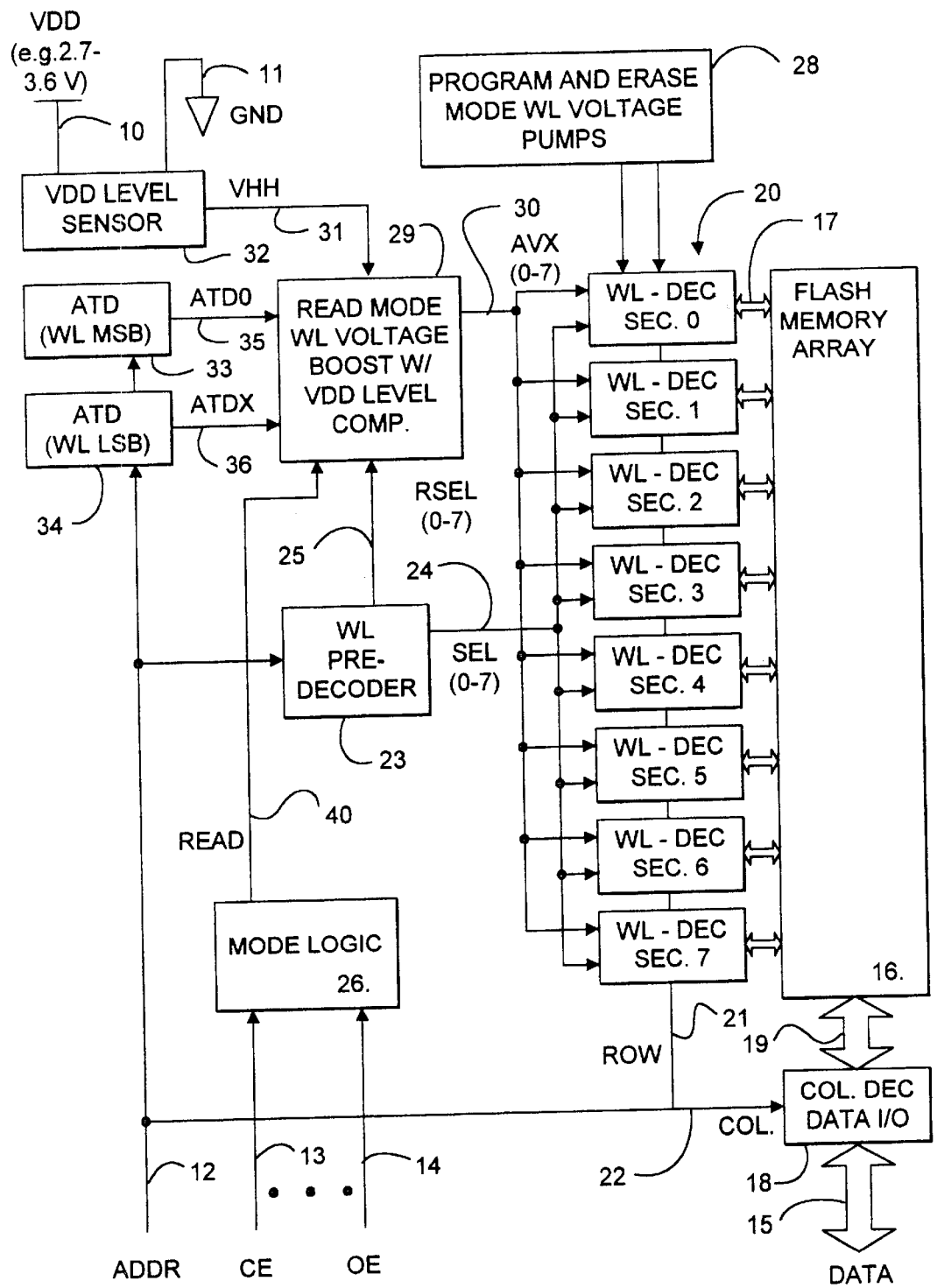
FIG. 1 is a block diagram of an integrated circuit memory device including the on chip voltage supply circuit of the present invention.

The detailed description of the embodiments of the present is provided with respect to FIGS. 1–9, in which FIG. 1 provides an overview of a flash memory device incorporating the on chip voltage supply circuit for generating read mode word line voltages. Thus, FIG. 1 illustrates an integrated circuit. The integrated circuit includes a supply voltage input 10 adapted to receive a supply voltage VDD. The supply voltage in one example embodiment is 2.7 to 3.6 volts. Also, a ground input 11 is provided. Other input and output pins are included on the integrated circuit including address inputs 12, control signal inputs such as a chip enable input 13 and an output enable input 14, and data input/output pins 15.

The integrated circuit includes a flash memory array 16 which includes a plurality of word lines represented for example by the arrows 17. The word lines are driven by a word line decoder that includes a plurality of sections, including word line decoder section 0, word line decoder section 1, word line decoder section 2, word line decoder section 3, word line decoder section 4, word line decoder section 5, word line decoder section 6, and word line decoder section 7 in this example. Also, a column decoder and data input/output circuit 18 is coupled to a plurality of bit lines represented by arrows 19 in the array 16. The column decoder 18 and the word line decoder 20 are controlled by addresses received from the address inputs 12. The address can be characterized as including row addresses on line 21 and column addresses on line 22 which drive the word line decoder 20 and the column decoder 18 respectively. Also, a word line predecoder 23 is included which is coupled to the address line 12. The word line predecoder generates select control signals SEL(0–7) on line 24 which are supplied respectively to the word line decoder sections 0–7. Three of the more significant bits of the row address portion of the address on line 12 are used to control the word line predecoder 23 and select a particular word line decoder section from the word line decoder 20. The word line predecoder 27 also generates control signal RSEL(0–7) on line 25.

Mode logic 26 is included on the chip. The mode logic 26 receives the chip enable and chip select signals on lines 13 and 14, as well as other signals in order to control the mode of operation of the flash memory. Flash memory devices include a read mode, a program mode, an erase mode, and other modes as suits a particular implementation for program and erase operations. A READ control signal on line 40 is generated by the mode control logic 26. Program and erase mode word line voltage pumps 28 are included on the chip. For the read mode, a read mode word line voltage boost circuit 29 is included. According to the present invention, the read mode word line voltage boost circuit 29 includes compensation for the level of the supply potential. The output of the read mode word line boost circuit 29 includes eight word line voltages AVX(0–7) on line 30 for the respective word line decoder sections. According to the present invention, the read mode word line voltage boost circuit 29 is responsive to the output on line 31 of a supply voltage level sensor 32. The supply voltage level sensor 32 is connected to the supply voltage input 10 and to the ground input 11 and generates an output on line 31 which indicates the level of the supply voltage at the input 10. Also, the read mode word line voltage boost circuit 29 is responsive to address transition detection circuits 33 and 34. The address transition detection circuit 33 generates a signal on line 35 which indicates the transition of the three more significant bits of the row address which are used to select a particular word line decoder section. Thus the signal ATD0 on line 35 indicates a transition between word line decoder sections in the word line decoder 20. The address transition detection circuit 34 is responsive to the less significant bits in the row address to indicate a transition between word lines. Thus the output ATDX on line 36 indicates a transition between word lines within a particular word line decoder section.

Thus, the present invention is applied as shown in FIG. 1 for word line voltage generation for the read mode of a flash memory device. The invention is particularly suited for flash memory with low power supply voltage in the range for example of 2.7 to 3.6 volts. According to the present invention, the supply voltage level is sensed, and the boosting power of the word line voltage generator is controlled in response to the level of the supply potential. Thus, when the supply potential is high, the boosting is reduced to save power. When the supply potential is low, the boosting is increased to establish and maintain a suitable word line voltage level. Furthermore, the present invention by controlling the amount of boosting in response to the level of the supply potential, reduces transient fluctuations in the on chip voltage which are generated by prior art systems, by limiting the amount of boosting at the high end of the supply potential.

In one preferred embodiment, the control signal generated by the sense circuit is a binary signal, indicating whether the supply potential is greater than or equal to 3.2 volts or other predetermined level for a regulated external power supply falling in the range of 2.7 to 3.6 volts. In alternative systems, more levels are sensed. For example, multiple comparators can be applied to detect three levels for example including greater than 3.3 volts, less than 3 volts, and between 3 and 3.3 volts. Therefore, performance in the terms of power dissipation, and otherwise, can be further optimized.

Figure 2:
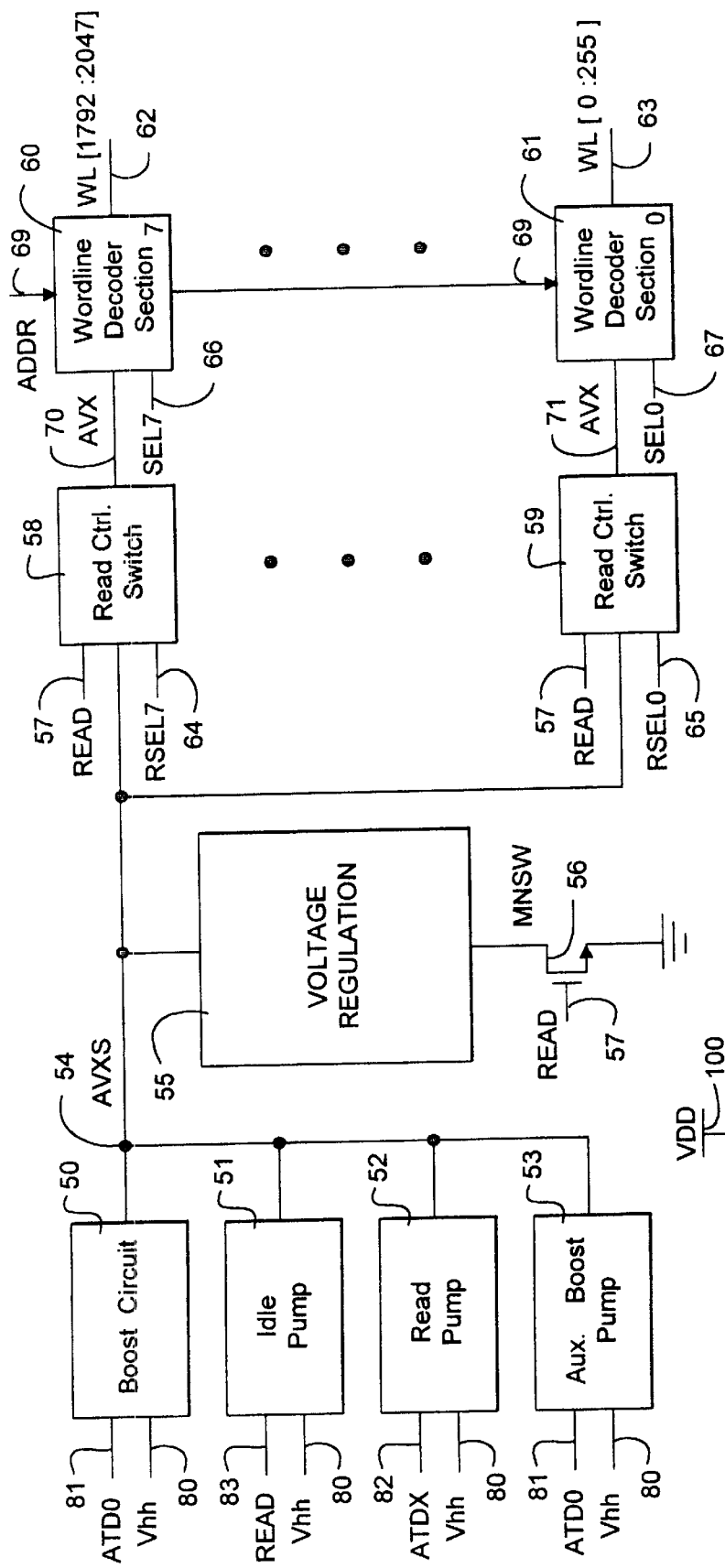
FIG. 2 is a block diagram of the word line boost circuit of the present invention for use in the system of FIG. 1.

A block diagram of the circuitry utilized according to the present invention is shown in FIG. 2. As shown in the figure, there are a number of circuit blocks including a boost circuit 50 (section boost pump), an idle pump 51, a read pump 52 (wordline boost pump), and an auxiliary boost pump 53. The boost circuit 50, idle pump 51, read pump 52, and auxiliary boost pump 53 all supply charge to a node 54 at which a voltage AVXS is established. A voltage regulation circuit 55 is coupled to node 54. The voltage regulation circuit 55 is enabled and disabled by transistor 56 having a control signal READ supplied at its gate on line 57 (corresponding to line 40 of FIG. 1). The control signal READ is set to a logic 1 when the device is in the read mode, and when the chip enable signal goes active. Thus, the voltage regulation circuit 55 is enabled in the read mode.

The node AVXS is coupled to word line driving circuits which include for each subset of the plurality of word lines a read control switch 58, 59, and a word line decoder section 60, 61. The word line decoder section 60 corresponds to the word line decoder section 7 of FIG. 1 and drives the word lines WL(1792:2047) on line 62. The word line decoder section 61 corresponds to the decoder section 0 of FIG. 1 and drives the word lines WL(0:255) on line 63.

The read control switch 58 and the word line decoder section 60 are used to drive word line decoder section 7. The control signal READ on line 57 is supplied to the read control switch 58. The control signal RSEL7 is supplied to the read control switch 58 on line 64. The output of the read control switch 58 is supplied on line 70 and provides a potential AVX to the word line decoder section 60. The word line decoder section 60 is enabled by the SEL7 signal on line 66, and the less significant bits of the address supplied on line 59. The output of the word line decoder section 60 is a subset of the plurality of word lines in the array on line 62. In this example, the subset includes word lines WL(1792:2047).

For word line decoder section 0, the read control switch 59 and the word line decoder section 61 are utilized. Read control switch 59 receives the READ signal on line 57, and the control signal RSEL0 on line 65. The output is the AVX voltage on line 71 which is supplied to the word line decoder section 61. The word line decoder section 61 is enabled by the SEL0 signal on line 67 and the address signals on line 69 to drive the word lines on line 63. In this example, the subset of word lines driven by the word line decoder section 61 includes word lines WL(0:255). Corresponding word line decoder sections 1, 2, 3, 4, 5 and 6 are not shown in FIG. 2 for simplicity, but include similar connections.

According to the present invention, the output of the supply voltage level sensor 32 is supplied on line 80 to each of the boost circuit 50, the idle pump 51, the read pump 52, and the auxiliary boost pump 53. The address transition detection circuits 33 and 34 of FIG. 1 supply the section transition signal ATD0 on line 81 to the boost circuit 50 and the auxiliary boost pump 53. The word line transition signal ATDX is supplied on line 82 to the read pump 52. The control signal READ is supplied on line 83 to the idle pump 51. Thus, the amount of charge supplied to the node 54 is dependent on the output of the supply voltage sensor 32 of FIG. 1. The operation of each of the boost circuit 50, idle pump 51, read pump 52 and auxiliary boost pump 53 are described in more detail below.

Figure 3:
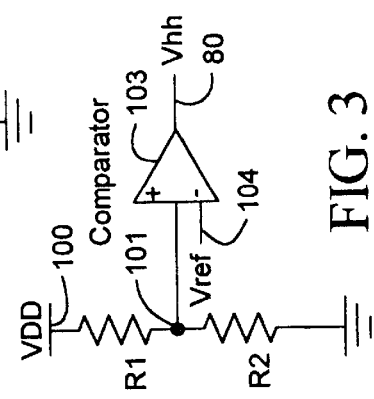
FIG. 3 is a simplified diagram of the supply voltage level sensor used in the system of FIG. 1.

FIG. 3 provides a simplified diagram of the supply voltage sensor 32 of FIG. 1. The supply voltage is applied at node 100 in FIG. 3. A first resistor R1 and a second resistor R2 are coupled in series between node 100 and ground. Node 101 is found between resistors R1 and R2. Node 101 is connected to the first input of a comparator 103 and a reference potential is supplied on a second input 104 to the comparator 103. The output of the comparator is the signal VHH which is applied on line 80 in FIG. 2. The comparator is used to detect the voltage level of the external power supply VDD. The comparator relies on a stable Vref on line 104. A preferred reference voltage is approximately 2 volts given a power supply of 2.7 volts to 3.6 volts. By appropriately selecting the ratio the resistors R1 and R2, the trip point of the comparator can be set. For example, if R1:R2=3:5, then the trip voltage is equal to 3.2 volts. In this case, the output VHH will be a logic 1 if the supply potential is greater than or equal to 3.2 volts, and a logic 0 otherwise.

Figure 4A:
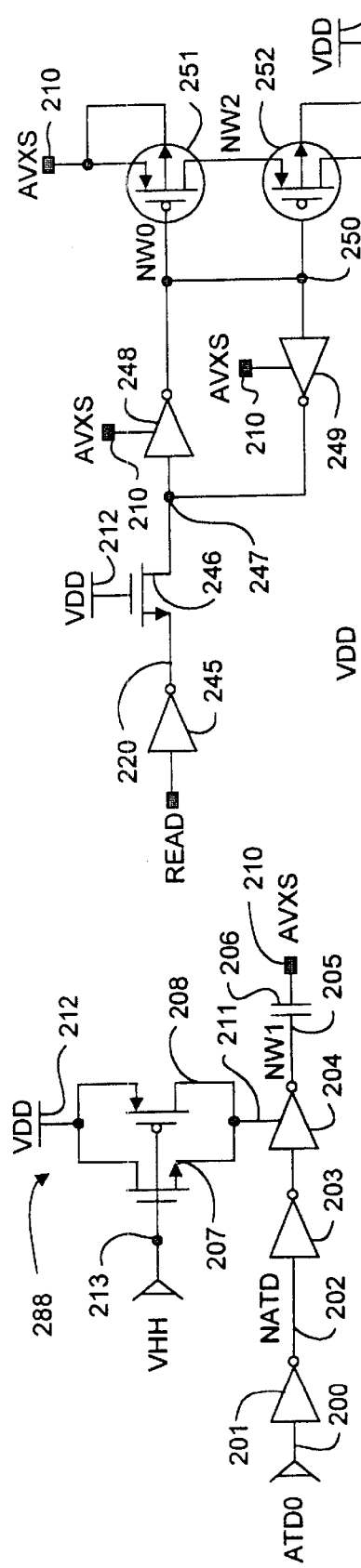
FIGS. 4A, 4B and 4C illustrate the components of the boost circuit used on transitions between word line decoder sections, and the voltage regulation circuit for the system of FIG. 2.
Figure 4C:
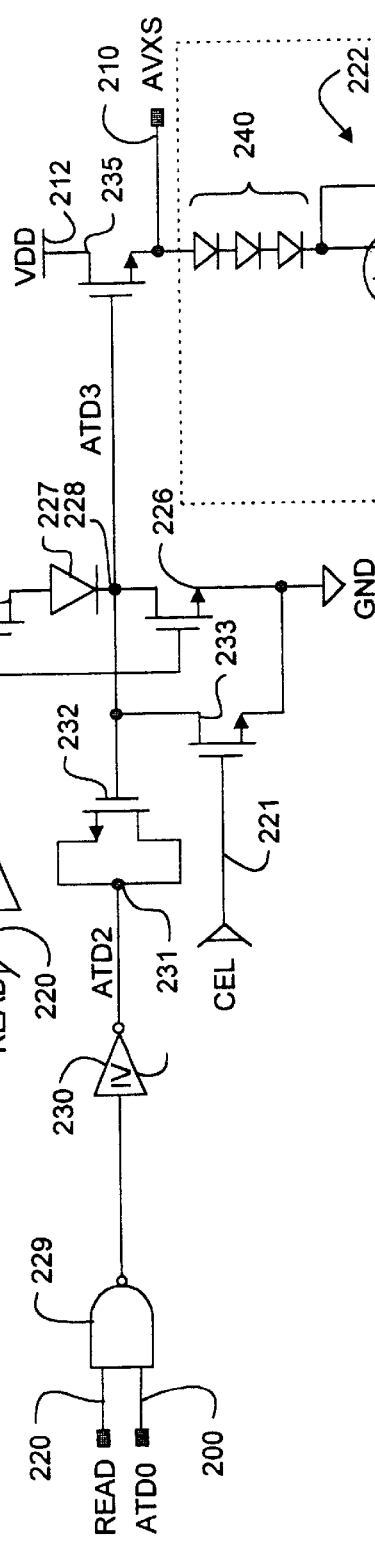
Figure 4B:
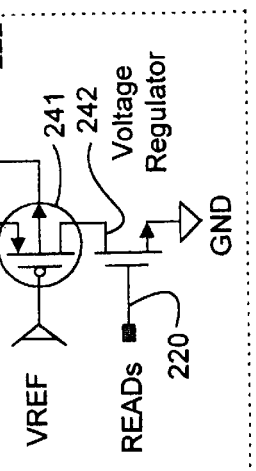

FIGS. 4A–4C illustrate one example boost circuit for use in the system of FIG. 3. In FIG. 4A, the first stage of the boost circuit is illustrated. The first stage in FIG. 4A receives as input the ATD0 signal on line 200. The signal is applied to first inverter 201 which generates a signal NATD on line 202. Line 202 is connected to inverter 203 which drives the input of inverter 204. The output of inverter 204 is applied to node 205 labeled NW1. Node 205 is connected across capacitor 206 to the AVXS node 210, which corresponds to node 54 of FIG. 2. The inverter 204 has its power supply terminal 211 coupled through the level selection circuit 288. The level selection circuit 288 includes n-channel transistor 207 and p-channel transistor 208 connected in parallel between the supply terminal 211 of the inverter 204, and the power supply input 212 which receives voltage VDD. The gates of the transistors 207 and 208 are connected to the VHH signal on line 213. Thus, if the signal VHH is high, the inverter 204 is driven to VDD minus VT, where VT is the threshold of transistor 207. When VHH is low, the supply terminal 211 on the inverter 204 is driven to VDD. Thus, the level of the output of the inverter 204 depends on the output of the comparator shown in FIG. 3.

The second stage of the boost pump is illustrated in FIG. 4B. The stage in FIG. 4B receives as input the READ signal on line 220, the address transition signal ATD0 on line 200, and the chip enable signal (active low) CEL on line 221. Also the output at node 210 is coupled to the voltage regulation circuit 222.

The READ signal on line 220 is connected to inverter 223. The output of inverter 223 is connected to node 224 labeled NX0. Node 224 is connected to the gate of p-channel transistor 225 and to the gate of n-channel transistor 226. P-channel transistor 225 has its source connected to the supply terminal 212, and its drain connected to the anode of diode 227. The cathode of diode 227 is connected to the node 228, labeled ATD3. Also, the READ signal on line 220 is connected as one input to NAND gate 229. The other input to the NAND gate 229 is the address transition signal ATD0. The output of NAND gate 229 drives inverter 230. The output of the inverter 230 is connected to node 231, labeled ATD2. Node 231 is coupled to the source and drain of capacitor connected transistor 232. The gate of transistor 232 is connected to node 228. The chip enable signal CEL on line 221 is connected to the gate of n-channel transistor 233. The drain of transistor 233 is connected to node 228, and the source of transistor 233 is connected to the ground terminal.

Node 228 is also connected to the gate of transistor 235. The source of transistor 235 is connected to output node 210. The drain of transistor 235 is connected to the supply terminal 212. A voltage regulator 222 is coupled to the output node 210. The READ signal on line 220 is supplied to the voltage regulator 222, and used to enable and disable the voltage regulator 222. A wide variety of voltage regulators 222 could be used. In this example, the voltage regulator 222 includes a forward biased diode string 240 connected between node 210 and the source and well of triple well p-channel transistor 241. The gate of transistor 241 is coupled to a reference voltage (for example 2.0 volts), and the drain of transistor 241 is connected to the drain of n-channel transistor 242, which has its source connected to ground, and its gate connected to the READ signal line 220. This circuit will clamp node 210 at about 4.8 volts.

The final stage of the boost circuit is illustrated in FIG. 4C. This circuit receives the READ signal on line 220 as input. The input 220 is connected to the inverter 245. The output of the inverter 245 is connected to the source of transistor 246. Transistor 246 has its gate connected to the supply terminal 212 and its drain connected to node 247. Node 247 is connected to the input of inverter 248 and the output of inverter 249. The inverters 248 and 249 have their supply terminals coupled to the node 210. The output of inverter 248 and the input of inverter 249 are connected to the node 250, labeled NW0. Node NW0 is connected to the gate of triple well p-channel transistor 251 and triple well p-channel transistor 252. Transistor 251 has its source and n-well coupled to the terminal 210 and its drain coupled to the source of transistor 252. The drain and n-well of transistor 252 are connected to the supply terminal 212.

In the circuits of FIGS. 4A–4C, transistors 232, 233, 226, 235, 241, 246, 251 and 252 have a thicker gate oxide, for example about 180 angstroms, than the other transistors in the circuit. The other transistors typically have a gate oxide thickness of about 100 angstroms. The thicker gate oxide allows for higher voltage operation. The transistors 232, 235 and 246 comprise "native mode" transistors, in which the channel region has the native substrate p-type doping. The other transistors have a threshold enhancement implant which raises the threshold of the transistor slightly. Thus, transistors 232, 235 and 246 have a lower threshold voltage than other transistors in the circuit.

In operation, the boost pump of FIGS. 4A–4C operates to boost the node 210 by an amount which is dependent on the signal VHH on line 213.

The address transistion signals ATD0 and ATDX, are produced using address transistion detection circuit, such as that described in our co-pending United States patent application entitled ADDRESS TRANSISTION DETECTION CIRCUIT, filed Nov. 15, 1996, having application Ser. No. 08/751,513, or another address transistion circuit as known in the art. A preferred length of an address transistion signal for this embodiment is about 20 nanoseconds for each transistion in the address signal supplied to the chip.

When the operation enters the read mode, the READ signal on line 220 goes high. This enables the voltage regulation circuit 222, and turns on transistor 225 and turns off transistor 226. Also, this signal causes node NW0 to go high turning off transistors 251 and 252. When the READ signal is low, the stage of FIG. 4C causes the node 210 to be driven to the supply potential 212, because node NW0 is low in this circumstance. When the address transistion signal ATD0 on line 200 goes high, the node 231 is driven high. Node 228 was at a low potential until the chip enable signal was pulsed low, turning off transistor 233. Transistor 225 is fully turned on and the node 228 is pulled to about the supply potential less the threshold drop across diode 227. The output AVXS is thus pulled to a level near the supply potential as well. When node 231 goes high, this pulls up node 228 to a level of about one and a half of the supply potential VDD. Consequently, transistor 235 is almost fully turned on, causing AVXS to be charged to about VDD level. The stage illustrated in FIG. 4A operates to boost the node AVXS in response to the signal ATD0 on line 200 and the signal VHH on line 213. When ATD0 goes high, node 202 goes low and node NW1 at point 205 goes low. When the address transistion signal returns to ground, node 205 is pushed high. This boosts node 210 across capacitor 206 an amount which depends on the voltage at node 211. Thus, if VHH is a logic 1, meaning that the sensing circuit indicated that the supply potential VDD is higher than a predetermined level, then the p-channel transistor in the inverter 204 is connected to the supply potential VDD through the n-channel transistor 207. Hence the node NW1 can only reach the supply potential minus a threshold voltage. This effectively reduces the final voltage level of AVXS on line 210 after the boosting. If the signal VHH is low, indicating that the supply potential is below the predetermined level, then the node 211 is charged to a value much closer to VDD. This results in boosting the node 210 AVXS by a larger amount when the supply potential is below the threshold.

Figure 8:
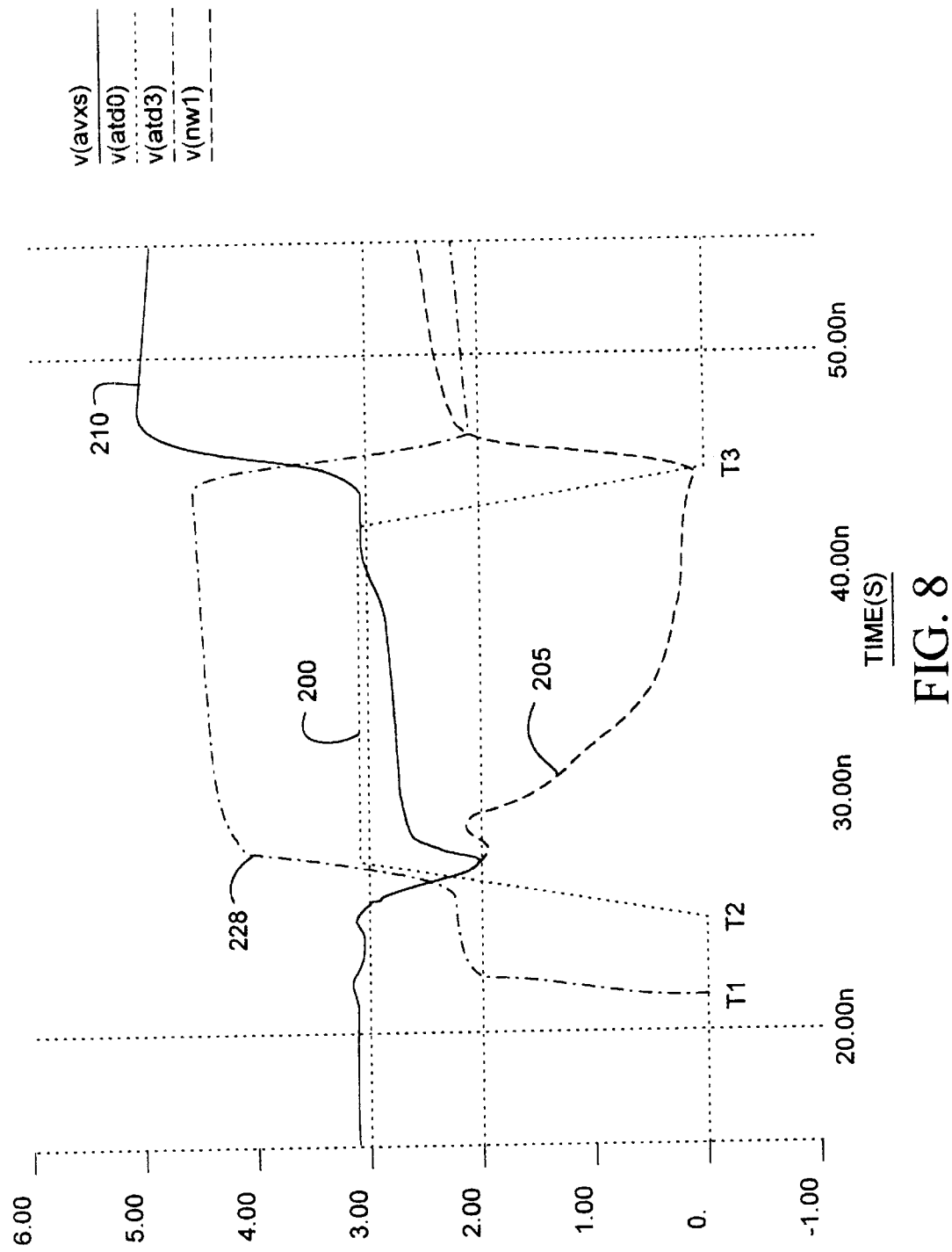
FIG. 8 is a plot of the voltage levels at selected nodes in FIGS. 4A–4C, used for illustrating the operation of the boost circuit.

FIG. 8 provides a partial timing diagram by which operation of the circuit of FIGS. 4A–4C can be understood. In FIG. 8, the voltages for various nodes in the circuit are shown. The traces are given the same reference number as their corresponding node in FIGS. 4A–4C. Thus, trace 210 corresponds to the voltage AVXS at node 210. Trace 200 corresponds to the voltage at node 200 for the address transistion detection signal ATD0, and trace 228 corresponds to the voltage ATD3 at node 228. Trace 205 corresponds to the voltage at node 205. As can be seen in FIG. 8, at time T1 the READ signal is asserted causing the node 228 to rise to a level slightly below the supply potential. At time T2, when the address transistion detection signal on trace 200 rises, node 228 rises to a level equal to about one and a half of the supply potential. At the same time node 205 begins to discharge to about the ground potential as driven by the output of inverter 204. AVXS is finally charged to slightly less than VDD level, since transistor 235 is almost fully turned on. At time T3, when the signal ATD0 on line 300 falls back to ground, node NW1 205 rises to about the level determined by the level controlling circuit 288. Node 228 falls. However, the boosting action which results from the rising of node 205 causes the voltage at node AVXS to rise to its full read potential close to 5 volts. The pumping energy provided by the boost circuit of FIGS. 4A–4C is sufficient to handle the parasitic capacitance of switches between word line decoder sections on the device.

Figure 5:
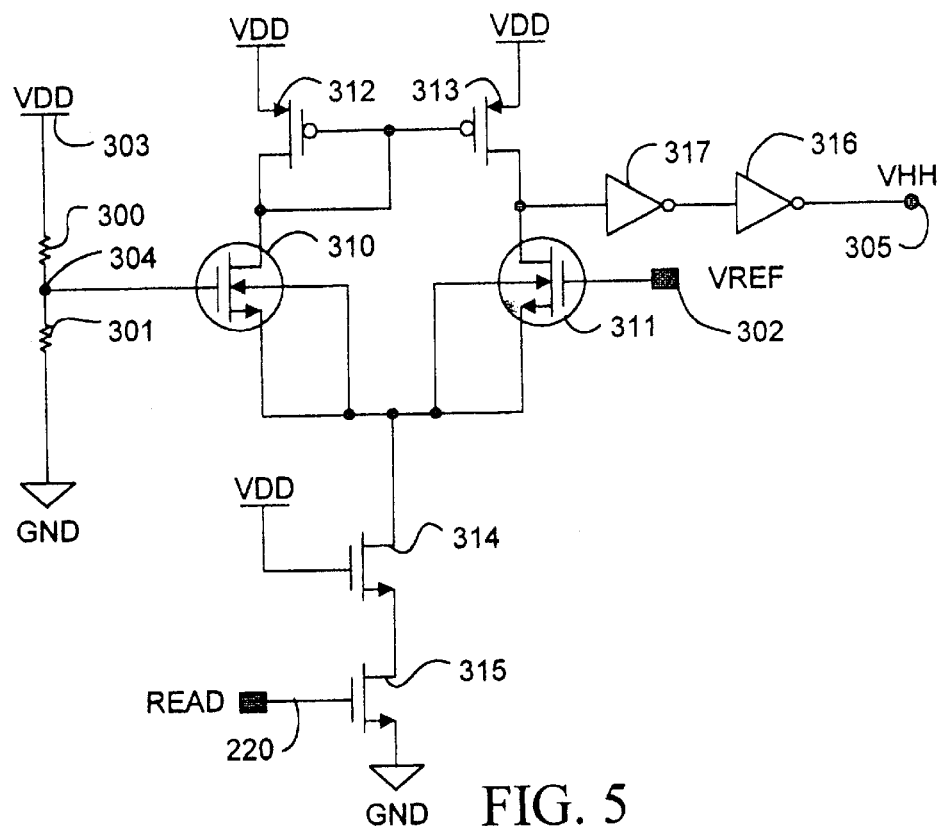
FIG. 5 is a more detailed block diagram of the sense circuit of FIG. 3.

FIG. 5 is a circuit diagram of the comparator 103 shown in FIG. 3 for one example implementation. According to the example illustrated where VDD is specified for the range between 2.7 and 3.6 volts, the resistors R1 and R2 of FIG. 3 are implemented by resistor 300 and resistor 301. The inputs to the comparator include the reference voltage VREF at node 302, and the divided supply potential at node 304. The supply potential is divided down by resistors 300 and 301. The reference voltage at node 302 is set to about 2 volts using a stable reference supply. The trip point of the comparator of FIG. 5 is determined by the selection of the values of the resistors 300 and 301. For example, if the ratio of resistor 300 to resistor 301 is about 3 to 5, then the trip point is about 3.2 volts. This results in the output VHH at node 305 being high if the supply potential at node 303 is above 3.2 volts, and low if the supply potential is below 3.2 volts.

The comparator is implemented by connecting node 304 to the gate of the triple well n-channel transistor 310, and connecting the reference potential at node 302 to the gate of triple well n-channel transistor 311. The drain of transistor 310 is connected to the drain of p-channel transistor 312. The gate of transistor 312 is connected to its drain, and the source of transistor 312 is connected to the supply potential. The drain of transistor 311 is connected to the drain of p-channel transistor 313 which has its source connected to the supply potential, and its gate connected to the gate of transistor 312. The source and n-well of both transistors 311 and 310 are coupled to the drain of n-channel transistor 314 which has its gate connected to the supply potential, and its source connected to transistor 315. N-channel transistor 315 has its gate connected to the control signal READ and its source coupled to ground. The output VHH on node 305 is driven by the inverter 316 which has its input driven by the output of inverter 317. Inverter 317 is connected to the node between transistors 311 and 313.

Figure 6:
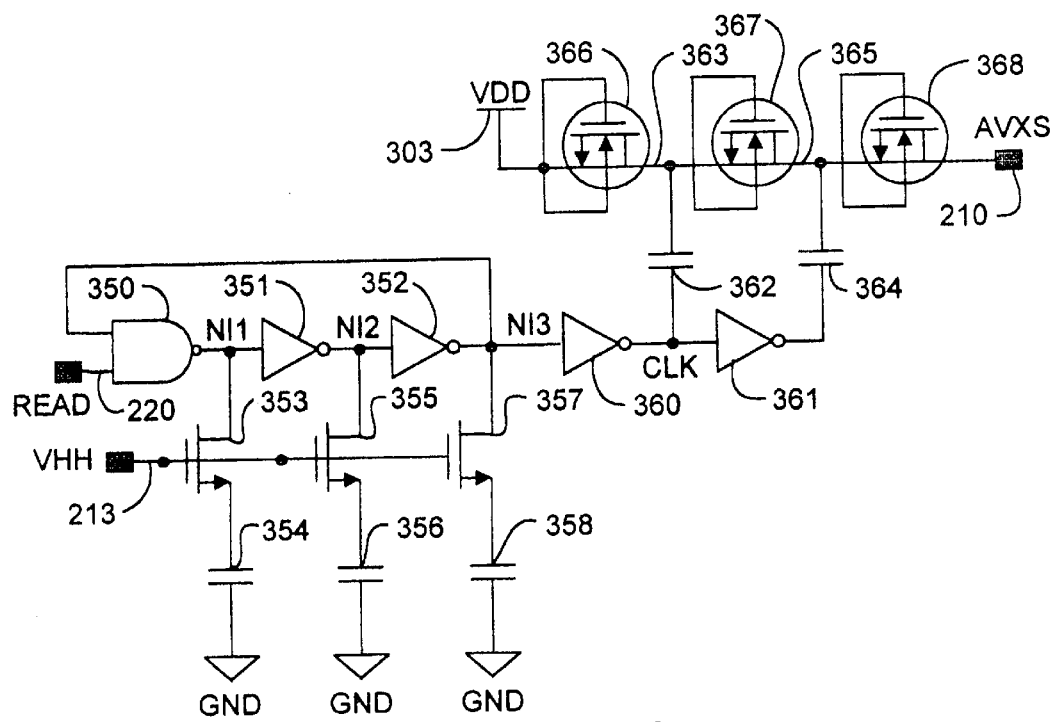
FIG. 6 is a schematic diagram of the idle pump for the system of FIG. 2.

FIG. 6 illustrates one example embodiment of the idle pump 51 as illustrated in FIG. 2. The idle pump serves to supply charge to the node 210 at which the voltage AVXS is generated in order to overcome gradual loss in voltage due to leakage current. Thus, if the chip enable signal is turned on, and there is no attempt to read data from the device for a long period of time the idle pump is necessary to maintain the voltage at node AVXS. The idle pump receives as inputs the READ signal on line 220, and the control signal VHH on line 213. An oscillator is implemented with NAND gate 350 which has its output connected to inverter 351, which in turn has its output connected to inverter 352. The output of inverter 352 is connected back as an input to the NAND gate 350. Thus, when the read circuit is high, the output of inverter 352 oscillates. The frequency of oscillation is determined by the control signal VHH. This is accomplished by connecting the drain of transistor 353 to the output of the NAND gate 350, the source of transistor 353 to capacitor 354, and the opposite node of capacitor 354 to ground. The gate of transistor 353 is connected to the control signal VHH. In a similar fashion, transistor 355 and capacitor 356 are coupled to the output of inverter 351. Also, transistor 357 and capacitor 358 are coupled to the output of inverter 352. This causes the frequency of oscillation at the output of inverter 352 to be a lower value when VHH is high, than when VHH is low. The idle pump receives as input the output of inverter 352. This input is supplied to the input of inverter 360 which has its output connected to the input of inverter 361. The output of inverter 360 is connected across capacitor 362 to node 363. The output of inverter 361 is connected across capacitor 364 to node 365. Three triple well n-channel transistors 366, 367, 368 are coupled in series between the supply potential at node 303, and the node 210 at which the voltage AVXS is generated. The transistors 366, 367, 368 are also "thick" transistors having gate oxides of about 180 angstroms. The pumping capability and consequently the power consumption of the charge pump used for the idle pump is dependent on the level VDD, and the frequency of oscillation. Thus when VDD is high, it is desirable to reduce the pumping frequency in order to reduce power consumption. The idle pump is a relatively weak pump in the sense that its pumping capability is small compared to the read pump. The main function of the idle pump is to supply charge to overcome losses due to leakage. As a result, the clock frequency of the idle pump is relatively slow, and the pumping capacitances 362, 364 are relatively small.

In certain applications however, the pumping capability of the idle pump can be enhanced. Such an approach is especially useful for low power supply situations. In this situation, a signal AVXS, may be pumped to a higher level by the idle pump, before the next read operation is requested. For example, the voltage level AVXS drops due to switching between word lines. If the level AVXS is not high enough, it takes more power for the read pump to recharge the voltage AVXS to the desired level between reads. By pumping the voltage level AVXS to higher levels before the next word line switch, the pumping capability of the read pump can be reduced. As a result, the total power of consumption can be reduced, by use of a more powerful idle pump.

In this embodiment, a two stage charge pump is shown. Depending on the value of the external power supply voltage and the target value of the voltage AVXS at node 210, single stage or larger number of stages could be used instead.

FIGS. 7A–7D illustrate an example implementation of the read pump 52 as shown in FIG. 2. The read pump is divided into four components. The first component shown in FIG. 7A generates a control signal BCK1 on node 400. The input is the address transition detection signal ATDX on line 401, which is generated upon the detection of the address transition in the less significant bits of the row address indicating a change between word lines, but not a change between word line sections. Thus, the signal ATDX is not asserted when the signal ATD0 is asserted. The circuit includes SR latch 402 which receives the ATDX signal at its S input. The output of the latch 402 is connected to node 403 which is fed back through a delay circuit comprised of inverter 404, capacitor 405, and inverter 406. The output of the inverter 406 drives the R input of the SR latch 402. This results in a pulse on node 403 of a duration which is set by the size of the capacitor 405, and the driving capacity of the inverter 404 and 406.

Node 403 is connected to inverter 407. The output of inverter 407 is connected to the input of inverter 408 to the output of the inverter 408 is connected to node 400 to supply the signal BCK1.

Figure 7A:
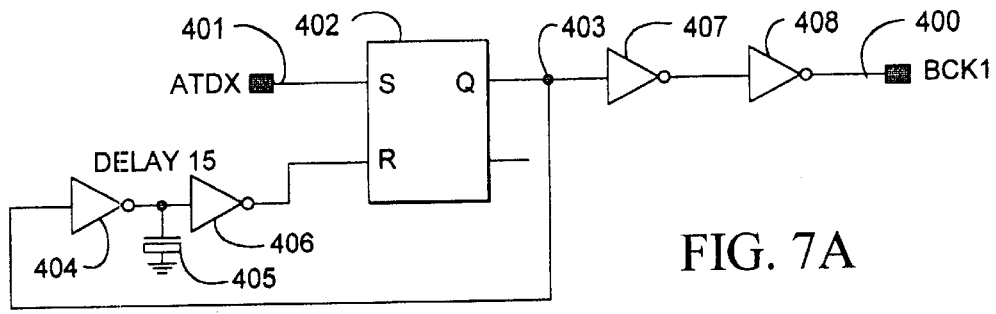
FIGS. 7A, 7B, 7C and 7D illustrate the implementation of the read pump in the system of FIG. 2.
Figure 7B:
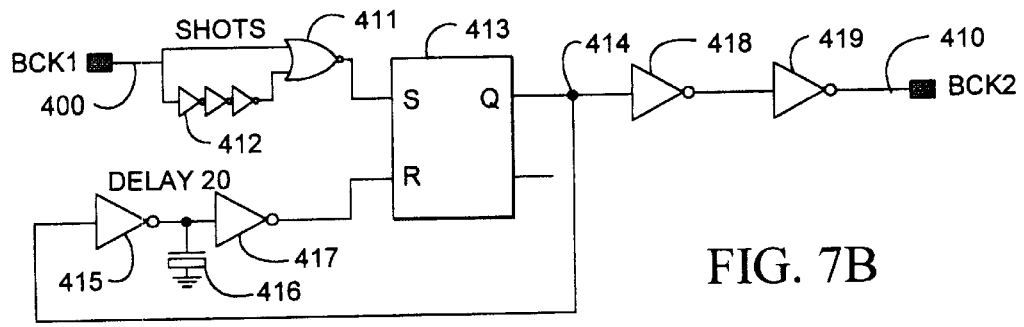

FIG. 7B illustrates the generation of the BCK2 on node 410. The input to the circuit in FIG. 7B is the control signal BCK1 from node 400. Node 400 is connected to a one shot circuit consisting of NOR gate 411 which has its input connected to node 400, and the other input connected to delay circuit comprised of a series of inverters 412, in this example three inverters in series. The output of the one shot circuit is a pulse which is supplied to the input of the SR latch 413. The output of the SR latch is connected to node 414 which is fed back through the delay circuit composed of inverter 415, capacitor 416, and inverter 417. The output of inverter 417 is connected to the R input of the SR latch 413. This results in a pulse at node 414 which is applied to the input of inverter 418. The output of inverter 418 is connected to the input of the inverter 419. The output of inverter 419 is the control signal BCK2 at node 410.

Figure 7C:
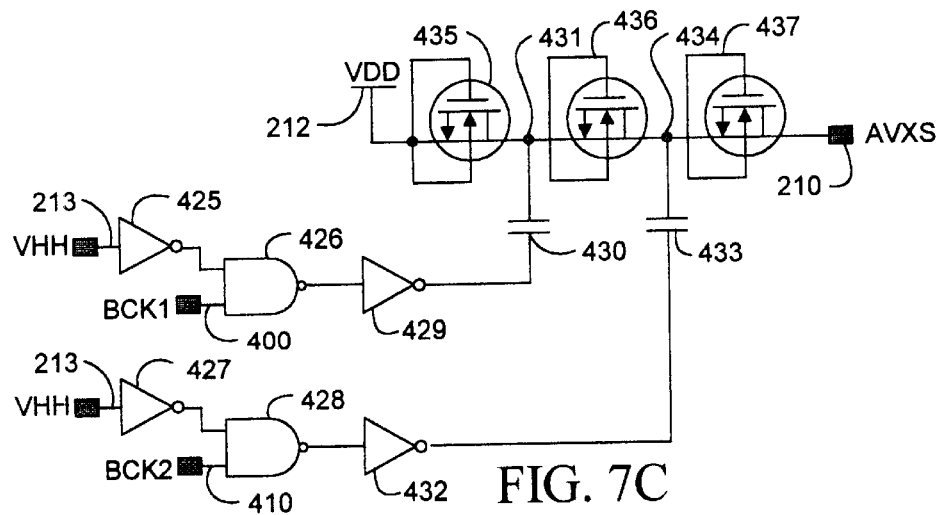
Figure 7D:
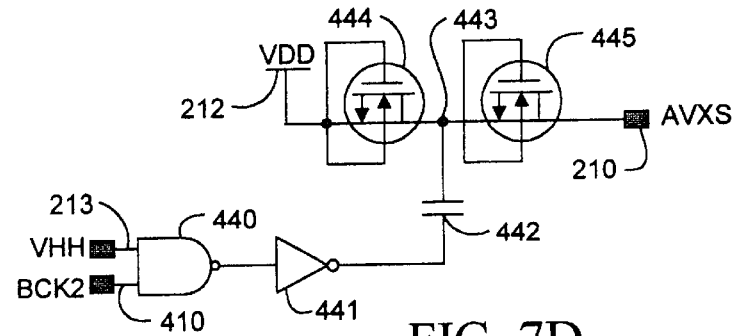

FIGS. 7C and 7D illustrate the alternative charge pump circuits used for the read pump. The charge pump which is selected depends on the value of the signal VHH. Also, the amount of pumping depends on the frequency and pulse widths of the control signals BCK1 and BCK2. FIG. 7C, is activated when the signal VHH is low. Thus, it receives as input the signal VHH from node 213. Node 213 is connected through inverter 425 as the input of NAND gate 426. The second input the NAND gate 426 is the control signal BCK1 on node 400. The signal VHH is also supplied through inverter 427 as a first input to NAND gate 428. The second input to the NAND gate 428 is the control signal BCK2 from node 410. The output of NAND gate 426 is connected through inverter 429 to capacitor 430. The opposite node at capacitor 430 is connected to node 431. The output of NAND gate 428 is connected through inverter 432 to capacitor 433. The opposite node at capacitor 433 is connected to node 434. A series of n-channel triple well transistors 435, 436 and 437 are connected in diode configurations. Transistor 435 has its anode connected to the supply potential at node 212. The cathode of diode connected transistor 435 is connected to node 431. Node 431 is connected to the anode of diode connected transistor 436, the cathode of which is connected to node 434. Node 434 is also connected to the anode of diode connected transistor 437. The cathode of diode connected transistor 437 is connected to the AVXS node 210.

The charge pump illustrated in FIG. 7D is enabled when the control signal VHH is high. Its inputs include the control signal VHH on line 213, and the control signal BCK2 on line 410. These signals are supplied as input to NAND gate 440. The output of NAND gate 440 is connected through inverter 441 through capacitor 442 to the node 443. A diode connected triple well transistor 444 is connected between the supply potential at node 212 and node 443. Node 443 is connected across diode connected triple well transistor 445 to the output node 210 at which the voltage AVXS is generated.

Figure 9:
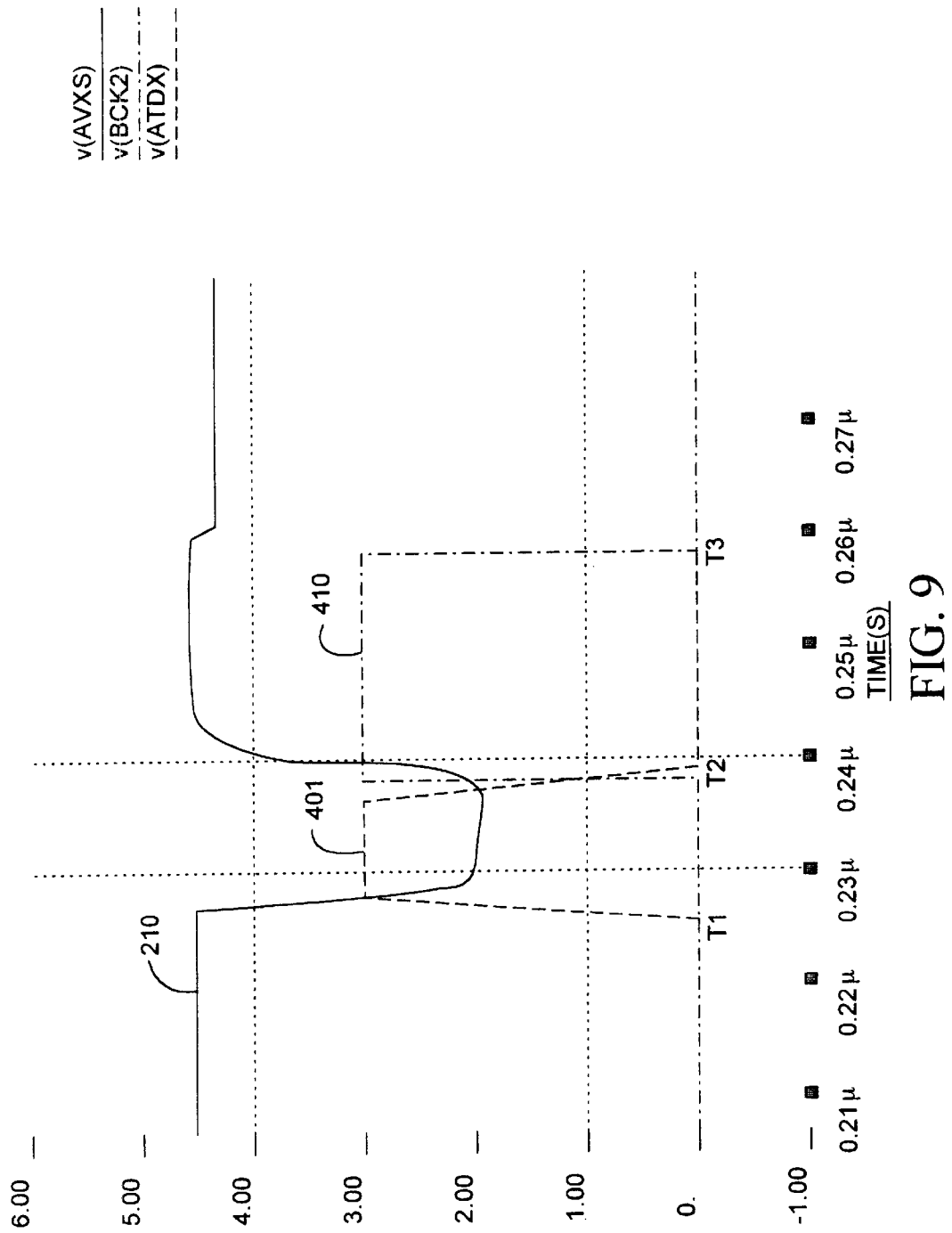
FIG. 9 is a graph of voltages at selected nodes in the circuits of FIGS. 7A–7D used for illustrating operation of the read pump.

In operation, each time a selected word line address changes, the node 210 at which AVXS is supplied loses charge because it is required to charge up the newly selected word line. For example, when a word line, such as WL0 is selected, it is charged up to the AVXS read level, for example about 4.5 volts. All the other word lines WL1-WLN within the word line decoder section, as well as word lines in other word line decoder sections remained at the ground level. If during the next read, another word line such as WL1 is selected, WL1 is charged up to the AVXS level, while word line WL0 is discharged to ground. Thus, the AVXS level is pulled to a lower level when the word line switches. This is illustrated in FIG. 9 for high VHH, in which the trace 210 corresponds to the signal AVXS, the trace 401 corresponds to the ATDX signal, and the trace 410 corresponds to the control signal BCK2. Thus, when the word line switches such as at time T1, the voltage at node AVXS drops. Also, the address transition signal is asserted. The signal BCK2 goes high a short time later, at time T2. This results in a pump in the charge of the signal ATDX back up to near its original level. When at time T3, the control signal BCK2 falls, the level ATDX falls slightly, but maintains its level of about 4.5 volts.

The read pump of FIGS. 7A–7D is designed to achieve this purpose. The signal VHH is used to determine which of the two read pumps, that of FIG. 7C or that of 7D is used. If the signal VDD is lower than the threshold value, then the two stage pump of FIG. 7C is used providing higher pumping capability. However, if the supply potential VHH is high, then the single stage pump with lower pumping capability is used. In this example, the pulse BCK1 triggered by the address transition detection signal ATDX has a preferred duration of about 15 nanoseconds. The pulse BCK2 is triggered by the falling edge of BCK1, and has a duration of about 20 nanoseconds. Thus, depending on the value of the external power supply voltage, and the target value of the AVXS, a read pump with different numbers of stages can be utilized. Also the duration of the pumping pulses can also be modified. Finally, it is pointed out that if the word lines do not switch for a next read operation, that is the data from the same word line address are to be read in sequence, the AVXS level does not drop significantly. Thus, no additional charge is needed to be supplied. In this case, the ATDX signal is not triggered. This further reduces power dissipation in the on chip voltage supply generator. The read pump in this example includes two stages. More stages could be used for a given embodiment, depending on such factors as the range of VDD and the target value of AVXS.

The auxiliary boost pump 53 shown in FIG. 2 is similar in implementation to the read pump, and can be adapted as suits the needs for a particular situation. Conventional boosting methods have a certain limit on the highest word line level which can be achieved. A theoretical maximum is twice the supply potential, and the practical maximum value is about 1.7 times the supply potential. However, if the supply potential is as low as 1.8 volts, the word line level can be boosted only to about 3.0 volts in this case. If a word line level must be at least 3.6 volts for example, the conventional auxiliary boost pump can be utilized to pump the word line level to this higher level after the initial boost. The structure of the auxiliary boost pump is like the read pump. This pumping capability however is smaller since it is only used for incremental increase in word line level after the initial boost. Furthermore, in this example it is only turned on in response to transitions between word line sections.

In alternative designs, the auxiliary boost pump can be merged with the read pump. In these situations, the ATDX signal is triggered also when the ATD0 signal is triggered. That is, the read pump is energized on all address transitions on the row address, rather than just on address transitions within a word line decoder section. This allows the read pump to increase the initial level of the AVXS voltage instead of the auxiliary boost pump.

The design parameters of the auxiliary pump are dependent on the boosted level that can be reached by the boost circuit. If the boost circuit alone is able to pull the AVXS node to a voltage level high enough for the read mode, no auxiliary pump is necessary. However, if the boost circuit alone is not enough to reach the desired range, then an auxiliary pump must be used. For example, if the target read mode AVXS range is 4.5 to 5.2 volts, and the power supply voltage is about 2.7 volts, the boost circuit is able to boost the node AVXS to about 4.2 volts. In this case we need the auxiliary pump to supplement the boost circuit so as to pull the final level of AVXS to above 4.5 volts, for example 4.6 volts. The auxiliary pump is able to supply the 0.4 voltage difference in this case. Furthermore, if after each word line switch, the AVXS drops to 3.2 volts, the read pump must be designed to supply at least 1.3 volts of difference. Thus, the read pump cannot be utilized as the auxiliary boost pump, because it would result in charging the AVXS level to a level which is too high as can be determined by adding the 1.3 volt read pump boost to the 4.2 volt boost circuit result. This shows a 5.5 volt value which exceeds the target range of 4.5 to 5.2 volts. In this case, an auxiliary pump is necessary. In another scenario, if the AVXS node drops to 4 volts after each word line switch, the read mode pump needs to be designed to pull the node from 4 volts back to about 4.5 volts. This is only a 0.5 volt difference. Consequently, the read pump can be utilized as the auxiliary pump, and still fall within the design target.

Accordingly, an on chip voltage supply circuit has been provided which is sensitive to the level of the power supply potential, to provide better control over the internal voltage generated, and a reduced power consumption. The invention is particularly suited for the generation of read voltages or other on chip voltages on flash memory devices, where power consumption is a critical design parameter, particularly in systems which are designed for low power supply potentials.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An integrated circuit having a voltage source input adapted to receive a supply voltage within a prespecified range of voltages, and including components on the integrated circuit using an on chip voltage higher than the prespecified range, comprising:
    a sense circuit, coupled to the voltage source input, which generates an output indicating a level of the supply voltage; and
    an on chip voltage supply circuit, coupled to the sense circuit and to the voltage source input, which generates the on chip voltage in response to the output of the sense circuit and to the supply voltage, wherein the on chip voltage supply circuit comprises a voltage boosting circuit having an input coupled to the voltage source input, which boosts a voltage on the input by an amount which depends on the output of the sense circuit, to produce the on chip voltage.

2. The integrated circuit of claim 1, wherein the output of the sense circuit comprises a binary signal which indicates whether the supply voltage is above a threshold within the prespecified range.

3. The integrated circuit of claim 1, wherein the output of the sense circuit indicates the level of the supply voltage relative to a plurality of thresholds.

4. The integrated circuit of claim 1, wherein the voltage boosting circuit comprises a first element which adds a first amount to the supply voltage to produce the on chip voltage, and a second element which adds a second amount to the supply voltage to produce the on chip voltage, the second amount being greater than the first amount.

5. The integrated circuit of claim 1, wherein the output of the sense circuit comprises a binary signal which indicates whether the supply voltage is above a threshold within the prespecified range; and the voltage boosting circuit comprises a first element which adds a first amount to the supply voltage to produce the on chip voltage in response to a first state of the binary signal, and a second element which adds a second amount to the supply voltage to produce the on chip voltage in response to a second state of the binary signal, the second amount being greater than the first amount.

6. The integrated circuit of claim 1, wherein the prespecified range of the supply voltage is about 2.7 to 3.6 volts, and the on chip voltage is greater than 3.6 volts.

7. The integrated circuit of claim 6, wherein the on chip voltage is within a range of about 4.5 to about 5.2 volts.

8. The integrated circuit of claim 1, wherein the on chip voltage supply circuit comprises:
    an idle pump which produces charge on a node in the integrated circuit to maintain an idle voltage level.

9. The integrated circuit of claim 8, wherein the voltage boosting circuit boosts the charge on the node in response to a transition of a control signal supplied to the integrated circuit.

10. An integrated circuit memory device, comprising:
    a voltage source input adapted to receive a supply voltage within a prespecified range of voltages;
    a memory array, including a plurality of word lines coupled to memory cells in the array, wherein the memory cells in the array have a first threshold below a read voltage to indicate a first memory state and a second threshold above the read voltage to indicate a second memory state;
    a plurality of address inputs adapted to receive addresses identifying selected memory cells in the array;
    word line driving circuits, responsive to the addresses to supply a word line voltage to selected word lines, in response to addresses on the address inputs;
    a sense circuit, coupled to the voltage source input, which generates an output indicating a level of the supply voltage within the prespecified range; and
    an on chip voltage supply circuit, coupled to the sense circuit, to the voltage source input, and having a node connected to the word line driving circuits, which generates the word line voltage at the node, in response to the output of the sense circuit and to the supply voltage.

11. The integrated circuit memory of claim 10, wherein the output of the sense circuit comprises a binary signal which indicates whether the supply voltage is above a threshold within the prespecified range.

12. The integrated circuit memory of claim 10, wherein the output of the sense circuit indicates the level of the supply voltage relative to a plurality of thresholds.

13. The integrated circuit memory of claim 10, wherein the on chip voltage supply circuit comprises a first element which adds a first amount to the supply voltage to produce the word line voltage, and a second element which adds a second amount to the supply voltage to produce the word line voltage, the second amount being greater than the first amount.

14. The integrated circuit memory of claim 10, wherein the output of the sense circuit comprises a binary signal which indicates whether the supply voltage is above a threshold within the prespecified range; and the on chip voltage supply circuit comprises a first element which adds a first amount to the supply voltage to produce the word line voltage in response to a first state of the binary signal, and a second element which adds a second amount to the supply voltage to produce the word line voltage in response to a second state of the binary signal, the second amount being greater than the first amount.

15. The integrated circuit memory of claim 10, wherein the on chip voltage supply circuit comprises a voltage boosting circuit having an input coupled to the voltage source input, which boosts a voltage on the input by an amount which depends on the output of the sense circuit, to produce the word line voltage.

16. The integrated circuit memory of claim 10, wherein the prespecified range of the supply voltage is about 2.7 to 3.6 volts, and the word line voltage is greater than 3.6 volts.

17. The integrated circuit memory of claim 16, wherein the word line voltage is within a range of about 4.5 to about 5.2 volts.

18. The integrated circuit memory of claim 10, wherein the on chip voltage supply circuit comprises:
   an idle pump which produces charge on the node to maintain an idle voltage level; and
   a boost pump, responsive to the output of the sense circuit, which boosts the charge on the node to establish the word line voltage by an amount indicated by the output of the sense circuit.

19. The integrated circuit memory of claim 18, wherein the boost pump boosts the charge on the node in response to a transition of a control signal supplied to the integrated circuit memory.

20. The integrated circuit memory of claim, 10, wherein the word line driving circuitry includes:
   a plurality of word line decoder sections, each section coupled to a corresponding subset of the plurality of word lines identified by a portion of an address; and
   a selector coupled to the node, and to the plurality of word line decoder sections, which is responsive to the portion of the address to connect the node to a selected word line decoder section.

21. The integrated circuit memory of claim 10, including:
   address transition detection circuits which detect a section transition in the portion of the address which identifies a word line decoder section, and a word line transition in another portion of the address which identifies a word line within a section, and wherein the on chip voltage supply circuit comprises:
      an idle pump which produces charge on the node to maintain an idle voltage level;
      a section boost pump, responsive to the output of the sense circuit and the section transition, which boosts the charge on the node by an amount dependent on the output of the sense circuit to establish the word line voltage for a selected decoder section; and
      a word line boost pump, responsive to the output of the sense circuit and the word line transition, which boosts the charge on the node to establish the word line voltage for a selected word line within a selected decoder section.

22. The integrated circuit memory of claim 21, wherein the address transition detection circuits produce a section transition signal in response to detection of a section transition, and produce a word line transition signal in response to detection of a word line transition but not a section transition.

23. The integrated circuit of claim 21, wherein the on chip voltage supply circuit comprises:
   an additional boost pump, responsive to the output of the sense circuit and the section transition, which boosts the charge on the node to establish the word line voltage for a selected decoder section in combination with the section boost pump.

24. The integrated circuit memory of claim 21, wherein the word line boost pump boosts the charge on the node by an amount dependent on the output of the sense circuit.

25. The integrated circuit memory of claim 21, wherein the additional boost pump boosts the charge on the node by an amount dependent on the output of the sense circuit.

26. An integrated circuit memory device, comprising:
   a voltage source input adapted to receive a supply voltage within a prespecified range of voltages;
   a memory array, including a plurality of word lines coupled to memory cells in the array, wherein the memory cells in the array comprise floating gate memory cells programmable to a first threshold below a read voltage to indicate a first memory state and to a second threshold above the read voltage to indicate a second memory state;
   a plurality of address inputs adapted to receive addresses identifying selected memory cells in the array;
   word line driving circuits, responsive to the addresses to supply a word line voltage to selected word lines, in response to addresses on the address inputs, including a plurality of word line decoder sections, each section coupled to a corresponding subset of the plurality of word lines identified by a portion of an address, and a selector coupled to the node, and to the plurality of word line decoder sections, which is responsive to the portion of the address to connect the node to a selected word line decoder section;
   address transition detection circuits, coupled to the plurality of address inputs, which detect a section transition in the portion of the address which identifies a word line decoder section, and a word line transition in another portion of the address which identifies a word line within a section;
   a sense circuit, coupled to the voltage source input, which generates an output indicating a level of the supply voltage within the prespecified range; and
   an on chip voltage supply circuit, coupled to the sense circuit, to the address transition detection circuits, to the voltage source input, and having a node connected to the word line driving circuits, which generates the word line voltage at the node, in response to the output of the sense circuit, to the address transition detection circuits and to the supply voltage.

27. The integrated circuit memory of claim 26, wherein the output of the sense circuit comprises a binary signal which indicates whether the supply voltage is above a threshold within the prespecified range; and the on chip voltage supply circuit comprises a first element which adds a first amount to the supply voltage to produce the word line voltage in response to a first state of the binary signal, and a second element which adds a second amount to the supply voltage to produce the word line voltage in response to a second state of the binary signal, the second amount being greater than the first amount.

28. The integrated circuit memory of claim 26, wherein the on chip voltage supply circuit comprises a voltage boosting circuit having an input coupled to the voltage source input, which boosts a voltage on the input by an amount which depends on the output of the sense circuit, to produce the word line voltage.

29. The integrated circuit memory of claim 26, wherein the prespecified range of the supply voltage is about 2.7 to 3.6 volts, and the word line voltage is greater than 3.6 volts.

30. The integrated circuit memory of claim 29, wherein the word line voltage is within a range of about 4.5 to about 5.2 volts.

31. The integrated circuit memory of claim 26, wherein the on chip voltage supply circuit comprises:

an idle pump which produces charge on the node to maintain an idle voltage level; and a boost pump, responsive to the output of the sense circuit, which boosts the charge on the node to establish the word line voltage by an amount indicated by the output of the sense circuit.

32. The integrated circuit memory of claim 26, wherein the on chip voltage supply circuit comprises:

an idle pump which produces charge on the node to maintain an idle voltage level; and a section boost pump, responsive to the output of the sense circuit and the section transition, which boosts the charge on the node by an amount dependent on the output of the sense circuit to establish the word line voltage for a selected decoder section; and a word line boost pump, responsive to the output of the sense circuit and the word line transition, which boosts the charge on the node to establish the word line voltage for a selected word line within a selected decoder section.

33. The integrated circuit memory of claim 32, wherein the address transition detection circuits produce a section transition signal in response to detection of a section transition, and produce a word line transition signal in response to detection of a word line transition but not a section transition.

34. The integrated circuit memory of claim 32, wherein the on chip voltage supply circuit comprises:

an additional boost pump, responsive to the output of the sense circuit and the section transition, which boosts the charge on the node to establish the word line voltage for a selected decoder section in combination with the section boost pump.

35. The integrated circuit memory of claim 32, wherein the a word line boost pump boosts the charge on the node by an amount dependent on the output of the sense circuit.

36. The integrated circuit memory of claim 32, wherein the additional boost pump boosts the charge on the node by an amount dependent on the output of the sense circuit.

37. The integrated circuit memory of claim 26, wherein the output of the sense circuit indicates the level of the supply voltage relative to a plurality of thresholds.

* * * * *